United States Patent
Morita

(10) Patent No.: US 8,591,805 B2
(45) Date of Patent: Nov. 26, 2013

(54) SILVER ALLOY HAVING EXCELLENT CONTACT RESISTANCE AND ANTIFOULING PROPERTY AND SUITABLE FOR USE IN PROBE PIN

(75) Inventor: Naoki Morita, Isehara (JP)

(73) Assignee: Tanaka Kikinzoku Kogyo K.K., Tokyo (JP)

(*) Notice: Subject to any disclaimer, the term of this patent is extended or adjusted under 35 U.S.C. 154(b) by 322 days.

(21) Appl. No.: 13/057,370

(22) PCT Filed: May 28, 2010

(86) PCT No.: PCT/JP2010/059087
§ 371 (c)(1),
(2), (4) Date: Feb. 3, 2011

(87) PCT Pub. No.: WO2010/137690
PCT Pub. Date: Dec. 2, 2010

(65) Prior Publication Data
US 2011/0133767 A1    Jun. 9, 2011

(30) Foreign Application Priority Data
May 29, 2009    (JP) .................. 2009-129992

(51) Int. Cl.
*C22C 5/08*    (2006.01)
*G01R 1/067*    (2006.01)

(52) U.S. Cl.
USPC ......... 420/502; 148/430; 148/431; 324/755.1

(58) Field of Classification Search
USPC .......................... 420/497, 502; 148/430, 431; 324/755.11
See application file for complete search history.

(56) References Cited

U.S. PATENT DOCUMENTS

| | | | | |
|---|---|---|---|---|
| 2,303,272 A | * | 11/1942 | Haskell | 420/502 |
| 2003/0180176 A1 | * | 9/2003 | Lin et al. | 420/502 |
| 2010/0176833 A1 | | 7/2010 | Morita et al. | 324/761 |

FOREIGN PATENT DOCUMENTS

| | | | |
|---|---|---|---|
| JP | 45-23406 | | 8/1970 |
| JP | 62-16896 | | 1/1987 |
| JP | 05-154719 | | 6/1993 |
| JP | 10-038922 | | 2/1998 |
| JP | 2002-71714 | | 3/2002 |
| JP | 2002-311055 | | 10/2002 |
| JP | 2004-076055 | | 3/2004 |
| JP | 2004-093355 | | 3/2004 |
| JP | 2005-66686 | | 3/2005 |
| JP | 2008304266 A | * | 12/2008 |
| WO | WO 2008/149886 | | 12/2008 |

* cited by examiner

Primary Examiner — Deborah Yee
(74) Attorney, Agent, or Firm — Roberts & Roberts, LLP

(57) ABSTRACT

The present invention is a silver alloy suitable for use in a probe pin made of an Ag-Cu alloy, wherein the silver alloy comprises 30 to 50% by weight of Cu and Ag as balance. This silver alloy further comprises 2 to 10% by weight of Ni to further improve strength. A probe pin made of these materials has stable contact resistance even under low contact pressure. The probe pin has excellent strength and antifouling property to adhesion of a foreign matter from a contact object due to repetitive use. Thereby, the probe pin usable in a stable manner for a long period of time can be obtained.

2 Claims, 2 Drawing Sheets

SILVER ALLOY HAVING EXCELLENT CONTACT RESISTANCE AND ANTIFOULING PROPERTY AND SUITABLE FOR USE IN PROBE PIN

TECHNICAL FIELD

The present invention relates to a silver alloy suitable for a wire rod constituting a probe pin for inspecting electrical property of a semiconductor integrated circuit or the like.

BACKGROUND ART

When electrical properties of a semiconductor integrated circuit formed on a wafer and a liquid crystal display or the like are inspected, a probe card having a plurality of probe pins arranged is used. This inspection is ordinarily performed by bringing the probe pins into contact with semiconductor integrated circuit elements as inspection objects formed on the wafer and a plurality of electrode pads of the liquid crystal display or the like.

Tungsten (W) and an alloy thereof (W—Re alloy or the like), beryllium steel (Be—Cu), phosphor bronze (Cu—Sn—P) and a palladium alloy (Pd—Ag alloy) or the like are exemplified as materials for the probe pin conventionally used.

PRIOR ART DOCUMENT

Patent Documents

Patent Document 1: Japanese Patent Appln. Laid-Open No. Hei 10-038922
Patent Document 2: Japanese Patent Appln. Laid-Open No. Hei 05-154719
Patent Document 3: Japanese Patent Appln. Laid-Open No. 2004-093355

SUMMARY OF THE INVENTION

Problems to be Solved by the Invention

Since the probe pin is a member brought into contact with the inspection object several million times, a material constituting the probe pin is required to have high hardness so that abrasion caused by repeated inspection is decreased. Since the probe pin is used in the inspection of the electrical property, an electrically conductive material having low specific resistance and good conductive property is preferably applied to the probe pin. The various materials described above are developed by focusing on the views of the hardness and specific resistance thereof.

However, in addition to the conventional demand described above, additional improvement of the properties is highly needed by calls for improvement in inspection efficiency and recent calls for correspondence to enhancement of density of the semiconductor integrated circuit or the like.

For example, in recent years, multi-pin formation increasing the number of probe pins mounted on the probe card proceeds as the improvement of the inspection efficiency. Herein, it is necessary to stabilize the contact resistance of the probe pin and the inspection object at the inspection. To that end, it is necessary to push the probe pin to the inspection object to some extent. A pushed amount (overdrive) for obtaining this stable contact resistance depends on a material. However, when the pushed amount is great, the contact pressure is increased. In the probe pin having high contact pressure, a burden to the inspection object is increased by the multi-pin formation. Therefore, a material for the probe pin capable of corresponding to the multi-pin formation is required to have small overdrive and stable contact resistance even at low contact pressure.

Pitch between the probe pins is inclined to narrow as the semiconductor integrated circuit or the like becomes densified. The miniaturization of the wire diameter of the probe pin is demanded in order to correspond to the inclination. The improvement of strength is also required in order to respond to this demand. However, in this case, the mere hardness enhancement is not the best measure for the strength improvement. Since the probe pin is repeatedly brought into contact with the inspection object at a high speed, and the probe pin continuously receives a stress load in a high temperature state caused by frictional heat from the contact, so-called creep deformation is concerned. Since this creep deformation is irreversible, the probe pin once deformed needs replacement. Property hardly deformable under a high temperature is, therefore, also demanded.

Furthermore, the probe pin is disadvantageously polluted by adhesion of a foreign matter from a contact object due to repetitive use. The problem of the oxidization film formation of the probe pin itself has been pointed out. However, the problem of the foreign matter adhesion is larger than that of the oxidization film formation. The stability of the contact resistance is lost by the pollution, and thereby, the probe pin may be unavoidably replaced. Resistance (antifouling property) to the pollution is, therefore, also important property.

The conventional material for the probe pin is hardly equipped with the additional demand properties described above. The present invention was developed in the light of the above-described situations, and provides a material having low contact pressure, improved high temperature strength and improved antifouling property.

Means for Solving the Problems

The present inventors have conducted earnest studies to solve the problems described above, and have found an alloy material for a probe pin having the various properties described above. The alloy material is mainly composed of silver (Ag), and contains copper of a predetermined range.

That is, the present invention is a silver alloy suitable for a wire rod for a probe pin made of an Ag—Cu alloy, wherein the silver alloy comprises 30 to 50% by weight of Cu and Ag as balance.

Since Ag is a good electric conductor having low specific resistance, Ag is a material suitable as the application to the probe pin. On the other hand, Ag has insufficient strength. The present invention adds Cu of a predetermined range as an alloy element to Ag to complement the insufficient strength, thereby balancing the specific resistance and the strength.

As described above, Cu has an action for enhancing the strength of the alloy. Cu is selected since Cu has the action for enhancing the strength and exerts a little influence on the conductive property of the alloy. As an alloy composition for use in the probe pin, 30 to 50% by weight of Cu is added. The added amount of Cu is limited to the range since the added amount of less than 30% by weight causes insufficient strength and the added amount exceeding 50% by weight facilitates the oxidization of the alloy.

The alloy according to the present invention may further comprise 2 to 10% by weight of Ni. Ni is further added in order to further clarify an improvement effect of the strength. The added amount of Ni is set to 2 to 10% by weight since the added amount of less than 2% by weight has little improvement effects and the added amount exceeding 10% by weight causes a problem in processability.

When the alloy according to the present invention is used as the probe pin, it is preferable that the probe pin is constituted as a so-called solid material wholly made of an alloy material. The probe pin has sufficient hardness and conductive property, and has also excellent oxidation resistance.

Advantageous Effects of Invention

As described above, the silver alloy suitable for the application of the probe pin according to the present invention has excellent stability of contact resistance, strength and antifouling property. The present invention can provide the probe pin capable of being stably used for a long period of time.

DESCRIPTION OF EMBODIMENTS

Hereinafter, suitable examples of the present invention will de described with comparative examples. In this embodiment, alloys having various kinds of compositions were manufactured, fundamental properties such as hardness and specific resistance were measured, and contact pressure, antifouling property and high temperature strength thereof were then estimated.

Each of metals as raw materials was melted under vacuum to produce an ingot (size: φ40 mm×6 mm) as a sample, which was rolled so that a sectional reduction rate was set to about 80%. The thickness after rolling was set to about 1.2 mm. The rolled stock was cut to produce a test piece having a length of 10 mm and a width of 1.0 mm. This test piece was embedded in a resin and polished to produce a sample for hardness measurement. A test piece having a length of 60 mm and a width of 10 mm was independently cut out from the rolled stock, to be used as a sample for specific resistance measurement.

The hardness measurement was performed with a Vickers hardness meter. The hardness measurement was performed under the conditions of a load of 100 gf and push time of 10 seconds. In the measurement of the specific resistance, electric resistance was measured by an electric resistance meter, and the specific resistance was calculated from the sectional area and length of the sample. These measurement results are shown in Table 1.

TABLE 1

|  | composition (wt %) | | | | | hardness | specific resistance |
| --- | --- | --- | --- | --- | --- | --- | --- |
|  | Ag | Cu | Ni | W | Re | (Hv) | (μΩcm) |
| Example 1 | 70 | 30 | — | — | — | 228 | 2.5 |
| Example 2 | 60 | 40 | — | — | — | 238 | 2.7 |
| Example 3 | 50 | 50 | — | — | — | 245 | 2.8 |
| Example 4 | 60 | 38 | 2 | — | — | 275 | 4.3 |
| Example 5 | 60 | 35 | 5 | — | — | 287 | 4.7 |

TABLE 1-continued

|  | composition (wt %) | | | | | hardness | specific resistance |
| --- | --- | --- | --- | --- | --- | --- | --- |
|  | Ag | Cu | Ni | W | Re | (Hv) | (μΩcm) |
| Example 6 | 60 | 30 | 10 | — | — | 300 | 5.6 |
| Comparative Example 1 | 40 | 60 | — | — | — | 260 | 3.0 |
| Comparative Example 2 | 90 | 10 | — | — | — | 190 | 2.2 |
| Comparative Example 3 | 80 | 20 | — | — | — | 210 | 2.4 |
| Comparative Example 4 | 60 | 25 | 15 | — | — | 310 | 6.1 |
| Conventional Example 1 | — | — | — | 100 | — | 700 | 5.4 |
| Conventional Example 2 | — | — | — | 97 | 3 | 800 | 6.0 |

Next, wires (wire diameter: 0.2 mm) were manufactured from the alloy ingots manufactured in the process described above. The wires were cut and processed to manufacture probe pins. The antifouling properties and the creep properties thereof were evaluated.

Figure 1:
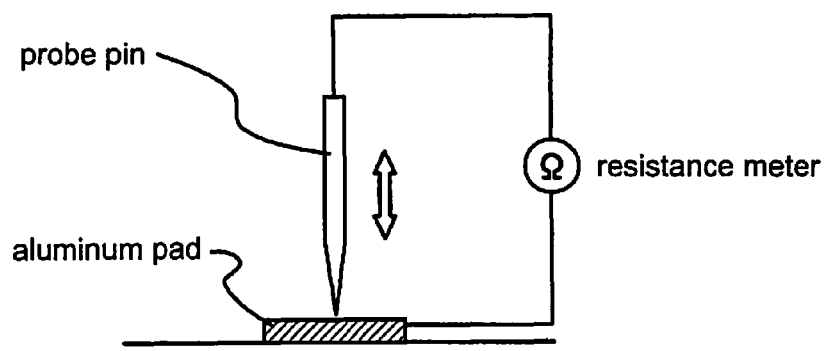
FIG. 1 is schematically shows a simulation test device for evaluating antifouling property and overdrive.

In order to evaluate the antifouling property, the probe pin was set in a simulation test device as shown in FIG. 1, and resistance values were measured while the probe pin and an aluminum pad are repeatedly brought into contact with each other (an impressed current was set to 100 mA per pin). The resistance value is increased with an increase in the number of contacting times. However, a time point when the resistance value exceeded 5Ω was defined as a polluted state requiring cleaning. The number of contacting times until the resistance value reached 5Ω was measured.

Figure 2:
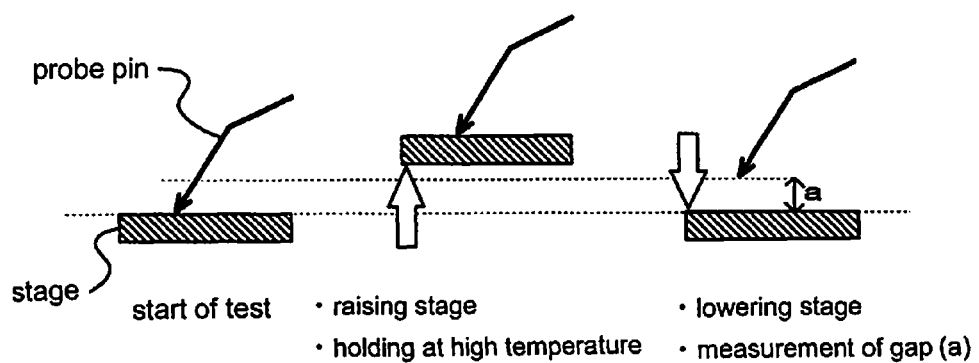
FIG. 2 is a view explaining a process of an evaluation test of creep property.

Evaluation of overdrive was performed in a process shown in FIG. 2. In this test, a stage is raised (0.1 mm) from a state where the probe pin is brought into contact with the stage heated to 100° C. This state is held for 100 hours, and the stage is then put back into the initial position. A distance (gap) between the tip of the probe pin after a load is removed and the stage is measured. When creep deformation is generated, the probe pin is still deformed after the load is removed to increase the distance. Herein, as the valuation basis of the creep property, a case where the distance between the tip of the probe pin and the stage was less than 40 μm was defined as acceptance (○), and a case where the distance was 40 μm or more was defined as rejection (x). Particularly excellent products (20 μm or less) of the acceptable products were defined as "⊚". The evaluation results of antifouling properties and creep properties thereof are shown in Table 2.

TABLE 2

|  | composition (wt %) | | | | | antifouling property (ten thousand times) | creep property |
| --- | --- | --- | --- | --- | --- | --- | --- |
|  | Ag | Cu | Ni | W | Re |  |  |
| Example 1 | 70 | 30 | — | — | — | 35 | ○ |
| Example 2 | 60 | 40 | — | — | — | 41 | ○ |
| Example 3 | 50 | 50 | — | — | — | 33 | ○ |
| Example 4 | 60 | 38 | 2 | — | — | 41 | ⊚ |
| Example 5 | 60 | 35 | 5 | — | — | 42 | ⊚ |
| Example 6 | 60 | 30 | 10 | — | — | 38 | ⊚ |
| Comparative Example 1 | 40 | 60 | — | — | — | 20 | x |
| Comparative Example 2 | 90 | 10 | — | — | — | 22 | x |
| Comparative Example 3 | 80 | 20 | — | — | — | 28 | ○ |

TABLE 2-continued

|  | composition (wt %) | | | | | antifouling property (ten thousand times) | creep property |
| --- | --- | --- | --- | --- | --- | --- | --- |
|  | Ag | Cu | Ni | W | Re | | |
| Comparative Example 4 | 60 | 25 | 15 | — | — | 15 | ● |
| Conventional Example 1 | — | — | — | 100 | — | 1 | ○ |
| Conventional Example 2 | — | — | — | 97 | 3 | 1 | ○ |

From Table 2, it becomes clear that the number of contacting times until pollution is observed exceeds 300,000 times in the probe pin in each example, with the result that the probe pin is extremely hardly polluted. It becomes clear that the creep deformation is also hardly generated, with the result that the probe pin is preferable in respect of strength. Tungsten and an alloy thereof as the conventional products are easily influenced by the pollution. The resistance values of the conventional products are increased in the number of contacting times of about 10,000 times, and the creep properties thereof are also not remarkably excellent. The probe pins manufactured as the comparative examples and having a concentration of copper and nickel outside a specified value exhibit properties more suitable than those of the conventional products. However, the probe pins are inferior to each example, and lack in the balancing of the antifouling property and the creep property.

In this embodiment, furthermore, the contact pressures of the probe pins made of the alloys of Examples 1, 2, 5 and 6 and Conventional Examples 1 and 2 were evaluated. This test uses the simulation test device shown in FIG. 1. The test measures the resistance value while changing the pushed amount (overdrive) of the tip of the probe pin to the pad. The test measures the overdrive until the resistance value is stabilized. The measurement results are shown in FIG. 3.

Figure 3:
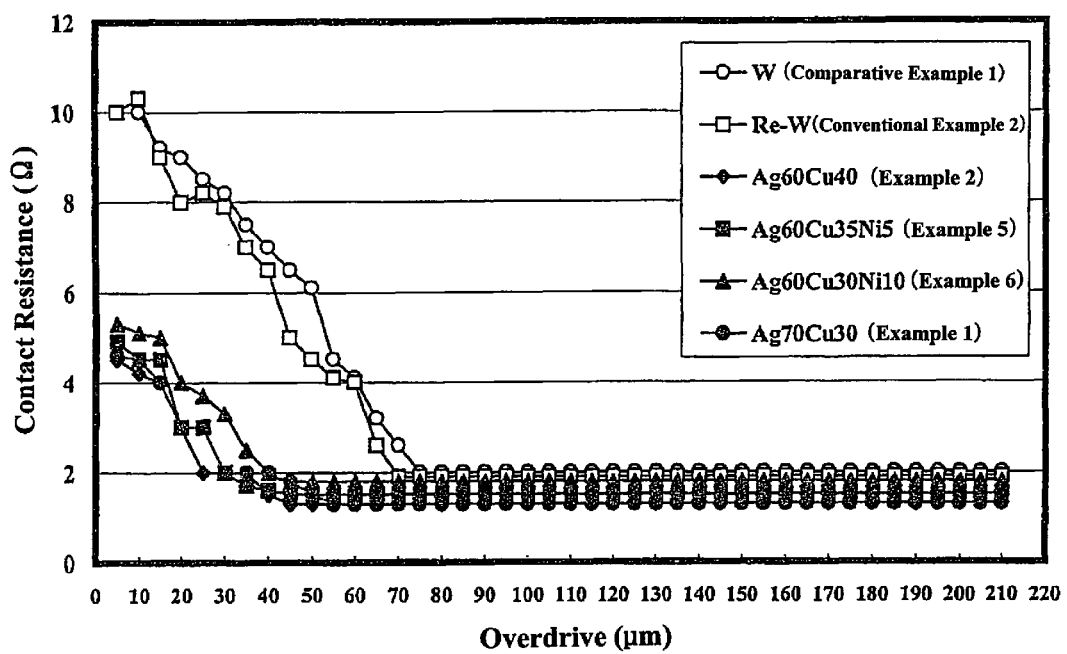
FIG. 3 is a view showing the relationship between overdrive and a contact resistance value of a probe pin made of an alloy of each of Examples 1, 2, 5 and 6 and conventional Examples 1 and 2.

From FIG. 3, it becomes clear that the probe pin according to each example has little overdrive until the stable contact resistance value is obtained. That is, it was confirmed that the stabilized contact resistance can be obtained in the probe pin according to each example even if the contact pressure is low.

Industrial Applicability

The silver alloy according to the present invention is a material suitable for use in the probe pin. The silver alloy has excellent antifouling property and creep property. The silver alloy exhibits stable electrical property at the low contact pressure. The probe pin according to the present invention having the improved properties can flexibly correspond to the calls for improvement of the inspection efficiency and the calls for correspondence to the density enhancement of the semiconductor integrated circuit, or the like.

The invention claimed is:

1. A probe pin mounted to a probe card for inspecting an electrical property of a semiconductor integrated circuit, wherein said probe pin comprises a silver alloy having a composition comprising 30 to 50% by weight of Cu and Ag as balance of at least 50% by weight.

2. The probe pin comprising the silver alloy according to claim 1, said silver alloy further comprising 2 to 10% by weight of Ni.

* * * * *